United States Patent [19]
Uekubo

[11] Patent Number: 6,163,484
[45] Date of Patent: Dec. 19, 2000

[54] NON-VOLATILE SEMICONDUCTOR STORAGE DEVICE HAVING IMPROVED PROGRAM/ERASE/OVER ERASE VERIFY

[75] Inventor: Masaki Uekubo, Tokyo, Japan

[73] Assignee: NEC Corporation, Tokyo, Japan

[21] Appl. No.: 09/299,021

[22] Filed: Apr. 26, 1999

[30] Foreign Application Priority Data

Apr. 27, 1998 [JP] Japan .................................. 10-116595

[51] Int. Cl.[7] .................................................. G11C 16/06
[52] U.S. Cl. .................................. 365/185.2; 365/185.29; 365/185.3; 365/189.07
[58] Field of Search ........................... 365/185.2, 185.21, 365/189.07, 185.22, 185.28, 185.29, 185.3, 210

[56] References Cited

U.S. PATENT DOCUMENTS

| 5,157,626 | 10/1992 | Watanabe | 365/185 |
|---|---|---|---|
| 5,754,475 | 5/1998 | Bill et al. | 365/185.25 |
| 5,859,796 | 1/1999 | Cleveland | 365/185.2 |
| 5,886,927 | 3/1999 | Takeuchi | 365/185.22 |
| 5,946,238 | 8/1999 | Compardo et al. | 365/185.2 |
| 5,982,662 | 11/1999 | Kobayashi et al. | 365/185.03 |
| 6,005,805 | 12/1999 | Tekeuchi | 365/185.22 |

FOREIGN PATENT DOCUMENTS

5-36288  2/1993  Japan .

*Primary Examiner*—Son T. Dinh
*Assistant Examiner*—Tuan T. Nguyen
*Attorney, Agent, or Firm*—Young & Thompson

[57] ABSTRACT

An electrically erasable and programmable non-volatile semiconductor storage device where data is read out by comparing the output of a memory cell and the output of a reference cell by a sense amplifier. In this device, the reference cell is built so that it has a given threshold voltage value, and the gate voltage of the memory cell and the gate voltage of the reference cell are allowed to be set independently.

17 Claims, 9 Drawing Sheets

NON-VOLATILE SEMICONDUCTOR STORAGE DEVICE HAVING IMPROVED PROGRAM/ERASE/OVER ERASE VERIFY

FIELD OF THE INVENTION

This invention relates to a non-volatile semiconductor storage device and, more particularly, to an electrically erasable and programmable non-volatile semiconductor storage device, such as a flash EEPROM.

BACKGROUND OF THE INVENTION

In recent years, UVPROM where stored contents are erased by ultraviolet rays and EEPROM (electrically erasable and programmable ROM) where stored contents are electrically rewritten using a special instrument have been used widely. EEPROM is facile and convenient since its user can program it electrically, while a conventional ROM, such as mask ROM that contents are built in as a mask when fabricated, employs a structural programming technique. However, its reliability to programming and erasing is generally lower than ROM. Namely, program verify to ensure easily that no output exists after programming by charging electric charge into a floating gate, and erase verify to ensure securely that certain output exists after erasing by discharging electric charge from a floating gate become important matters.

Figure 1:
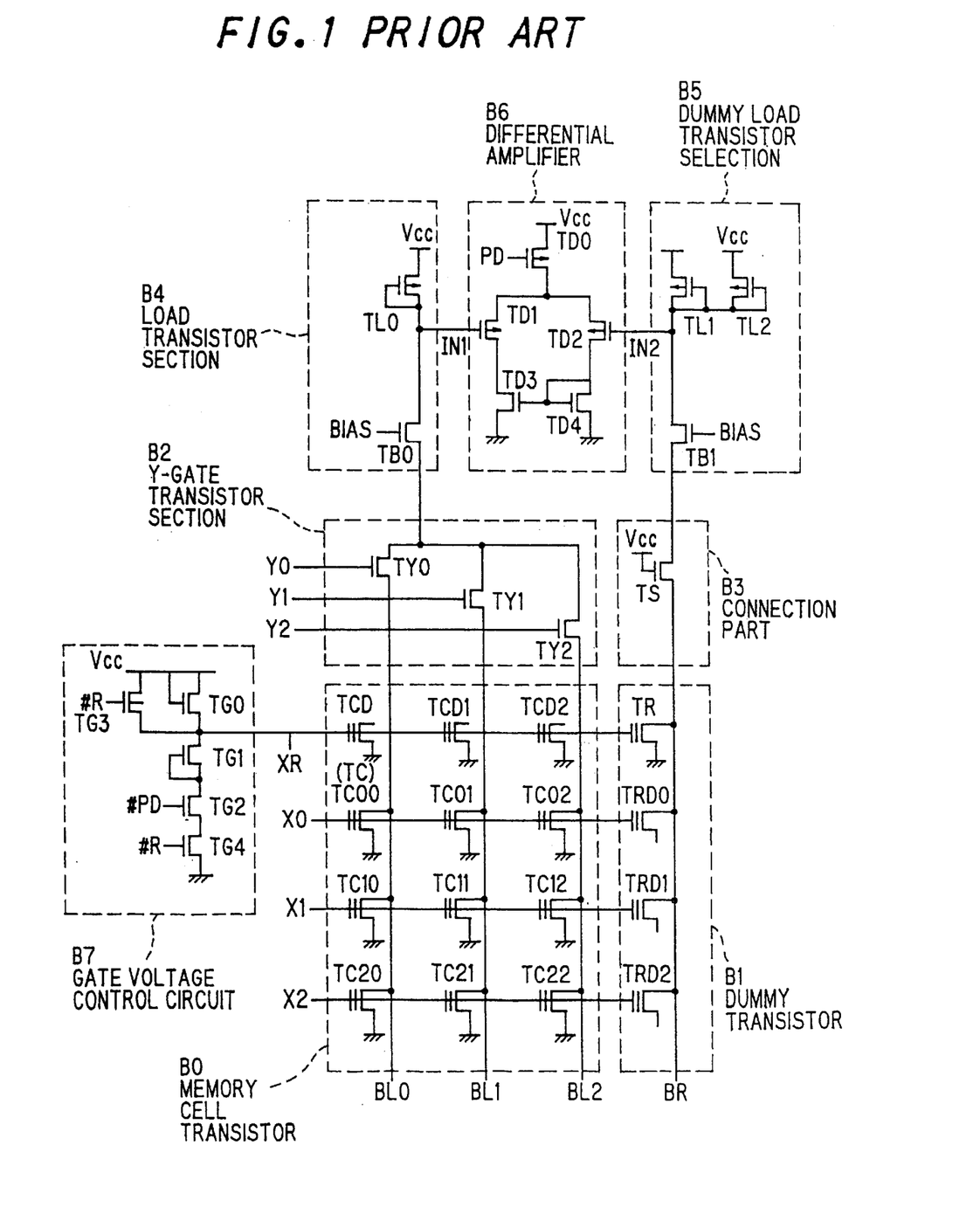
FIG. 1 is a circuit diagram showing the conventional non-volatile semiconductor storage device.

A conventional examples of this kind of non-volatile semiconductor storage device is shown in FIG. 1. This non-volatile semiconductor storage device is EEPROM disclosed in Japanese patent application laid-open No. 5-36288 (1993). The reading output of a memory cell transistor TC00 etc. is led through a Y-gate transistor section B2 to a load transistor section B4, and the reading output of a dummy transistor TRD0 etc. is led through connection part B3 to a dummy load transistor section B5.

The load transistor section B4, the dummy load transistor section B5 and a differential amplifier B6 compose a sense amplifier. The differential amplifier B6 outputs amplifying the different between input IN1 from the load transistor section B4 and IN2 from the dummy load transistor section B5 when power-down signal line PD becomes "L" in its operation. In the dummy load transistor section B5, two dummy load transistors TL1 and TL2 are connected in parallel between power source voltage Vcc and output of dummy transistor TRD0 etc. Therefore, the equivalent resistance value of the dummy load transistors TL1 and TL2 is a half of the equivalent resistance value of a load transistor TL0 on the load transistor section B4 side. Here, since the gates of the memory cell transistor TC00 and dummy transistor TRD0 are connected to a same word line X0, they have same current drive power. Also, since in a gate voltage control circuit B7, a read bar signal line #R is "L", same applies to a reference transistor TR. Therefore, input IN2 outputs an intermediate voltage between when IN1 is reading out "1" and when IN1 is reading out "0", which means that a proper reference voltage is applied to the differential amplifier B6. Meanwhile, "0" means programming and "1" means erasing.

Next, in the program verify, since the read bar signal line #R becomes "H", a reference transistor gate line XR is provided with a low voltage defined by the ratio of transistor TG0 and pull-down side TG1 etc. Therefore, the reference transistor TR has low current drive power because of having a lower gate voltage than the memory cell transistor TC00. So, input IN2 becomes a value nearer to the voltage when reading out "0" than the above intermediate voltage between when IN1 is reading "1" and when IN1 is reading out "0". Thus, a standard to judge data programmed as "0" becomes severe, whereby it is intended to ensure that a sufficient programming is conducted.

Figure 2:
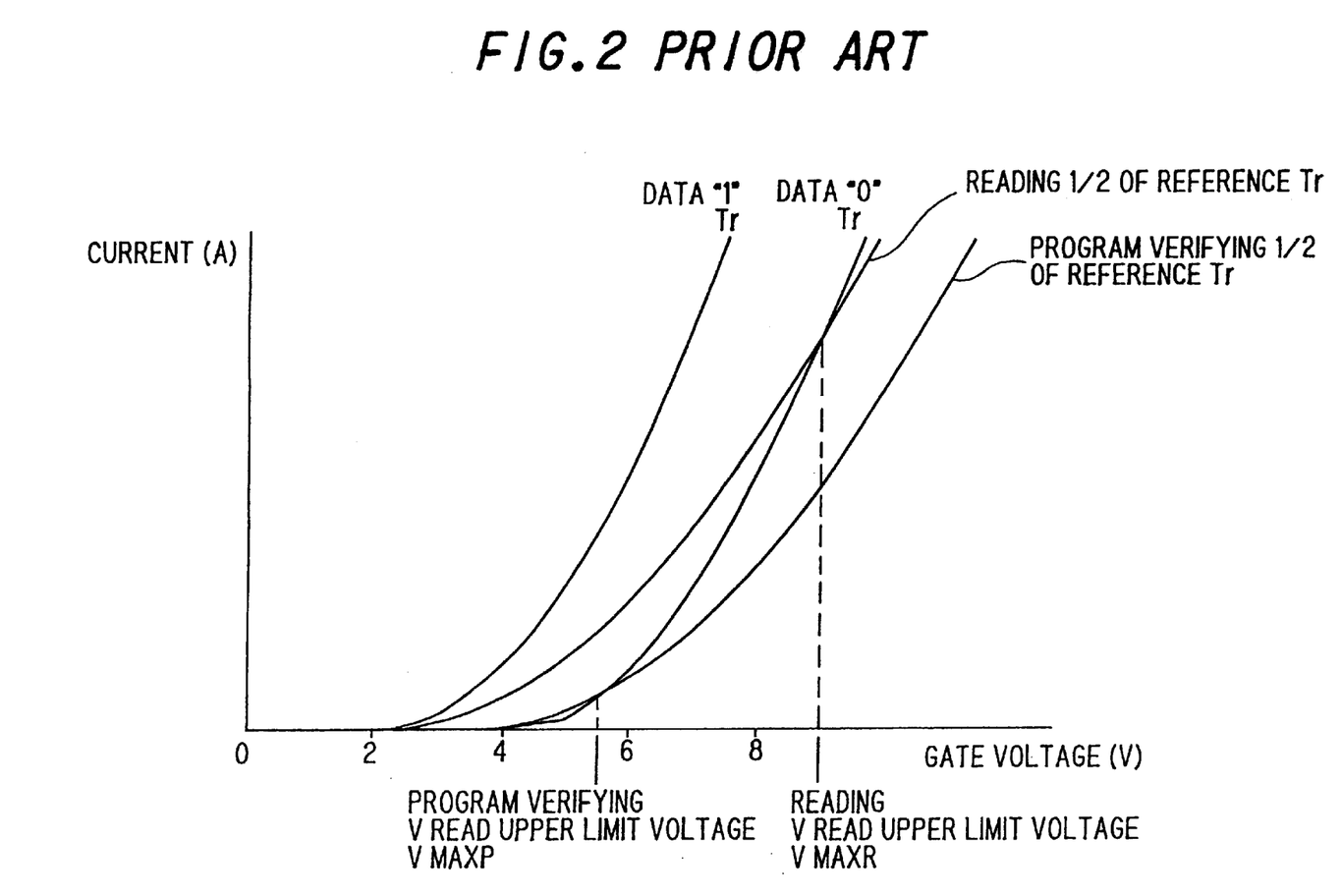
FIG. 2 is a graph showing a current-to-gate voltage curve of a reference transistor in reading and verifying for the device in FIG. 1.

However, in the above conventional non-volatile semiconductor storage device, the threshold voltage of the reference transistor TR is not built in accurately in the fabrication process, and in the program verify, the voltage of the reference transistor gate line XR is determined by many elements like the transistors TR0, TG1 etc. Also, since even in the verifying, the dummy load transistors TL1 and TL2 remain connected in parallel, its resistance is a half of the load transistor TL0. Further, in the verifying, the value of reference current is also small. Therefore, as shown in FIG. 2 transcribed from FIG. 2 of Japanese patent application laid-open No. 5-36288 (1993), it operates in a region where the slope of current versus voltage curve for reference transistor TR is gentle, and has a large dispersion of operating point. Because of this, there is a problem that the judging condition in the program verifying is rougher than that in the reading and lacks in fineness.

This problem may be not material to a general EEPROM whose erasing is conducted with the support of ultraviolet rays. However, in flash EEPROM that has been used rapidly in the portable-use field with the recent popularization of personal computer and portable telephone, it is serious. Namely, the erasing of flash EEPROM is conducted by only an electrical means without the support of ultraviolet rays, and therefore a device structure suitable for that needs to be employed. So, the dispersion of erasing increases and there occurs an unevenness in erasing, which is not seen in the ultraviolet-ray erasing. Therefore, it is necessary to conduct the program verify finely. Also, adding to the erase verify, the over-erase verify also needs to be conducted.

SUMMARY OF THE INVENTION

Accordingly, it is an object of the invention to provide a non-volatile semiconductor storage device having a reference level in verifying EEPROM that can be set finely.

It is a further object of the invention to provide a non-volatile semiconductor storage device where verifying required for a flash EEPROM can be conducted very accurately.

It is a still further object of the invention to provide a non-volatile semiconductor storage device that can attain the above objects using a simple device composition.

According to the invention, provided is an electrically erasable and programmable non-volatile semiconductor storage device having data read out by comparing the output of a memory cell and the output of a reference cell by a sense amplifier, wherein:

the reference cell is built in so that it has a given threshold voltage value, and the gate voltage of the memory cell and the gate voltage of the reference cell are allowed to be set independently.

In this invention, the threshold voltage of reference cell is built in so as to have an accurate value in the manufacturing process of the reference cell. This value is set to be the upper-limit value of threshold voltage for the erasing of memory cell in the same chip. Also, there is only one reference cell, and its gate voltage can be set independently of the gate voltage of a memory cell. The sensitivity of sense amplifier is made symmetrical during verifying. Therefore, with the simple device composition, the verifying can be conducted finely, which helps enhance the reliability of especially a flash EEPROM.

BRIEF DESCRIPTION OF THE DRAWINGS

The invention will be explained in more detail in conjunction with the appended drawings, wherein.

DESCRIPTION OF THE PREFERRED EMBODIMENTS

The preferred embodiment of the invention will be explained below.

A non-volatile semiconductor storage device according to the invention is characterized that the reference cell is built so that it has a given threshold voltage value, and the gate voltage of the memory cell and the gate voltage of the reference cell are allowed to be set independently.

The preferred embodiment of the invention will be explained below, referring to the drawings.

Figure 4:
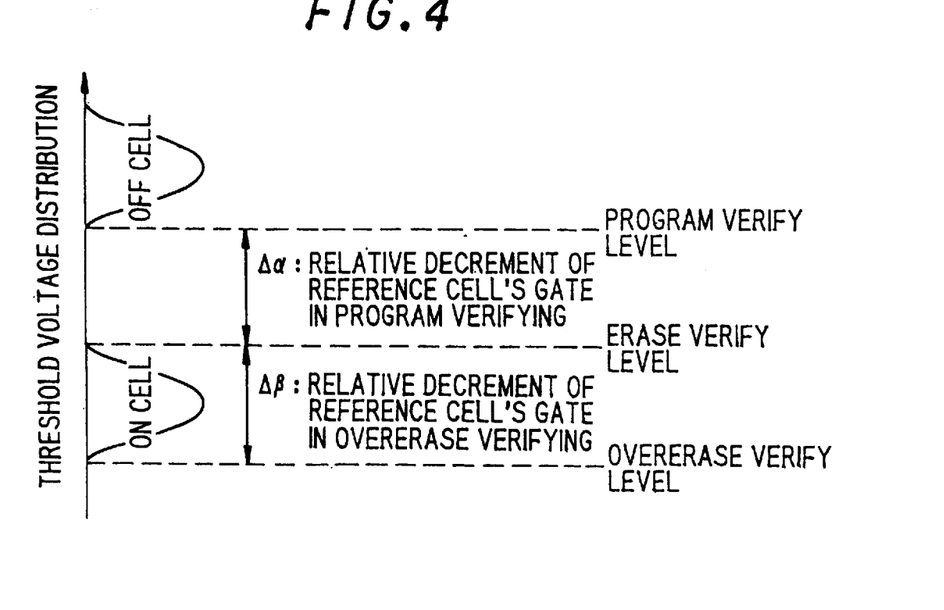
FIG. 4 is an illustration showing a threshold voltage distribution of flash EEPROM.

At first, the program verify and erase verify in EEPROM and further the over-erase verify in flash EEPROM are explained briefly. As known, in EEPROM, programming is conducted by charging electric charge into a floating gate and erasing is conducted by discharging electric charge from the floating gate by an electrical means. However, after manufacturing, the threshold voltages of memory cell (OFF cell) in programming and memory cell (ON cell) in erasing present a dispersion like the normal distribution as shown in FIG. 4. The lateral axis in FIG. 4 indicates the number of memory cells. The reason why this dispersion occurs is mainly that the amount of electrons to be injected into or extracted from the floating gate is dispersed due to a dispersion in voltage to be applied to the control gate or in application time, or a dispersion in film thickness or gate size of gate oxide film.

Accordingly, in order to obtain a high-reliability EEPROM, it is necessary to conduct the program verify to verify that the threshold voltage of memory cell in programming is higher than the lower-limit value (program verify level) and the erase verify to verify that the threshold voltage of memory cell after erasing is lower than the higher-limit value (erase verify level). For a flash EEPROM that has been popularized rapidly in recent years, the program verify and erase verify need to be conducted more accurately than that for a general EEPROM, the over-erase verify is also necessary. Further, for a flash EEPROM, the over-erase verify is also necessary. The over-erase means an excessive erasing, which is caused due to the excessive discharging of electric charge from the floating gate, the drain current flows even when the memory cell is of depletion type, i.e., even when the gate voltage is 0V, thereby the memory cell is sensed as if it is selected even when it is not selected actually. Therefore, the over-erase verify needs to verify that the threshold voltage of memory cell after erasing is higher than the lower-limit value (over-erase verify level).

Figure 5:
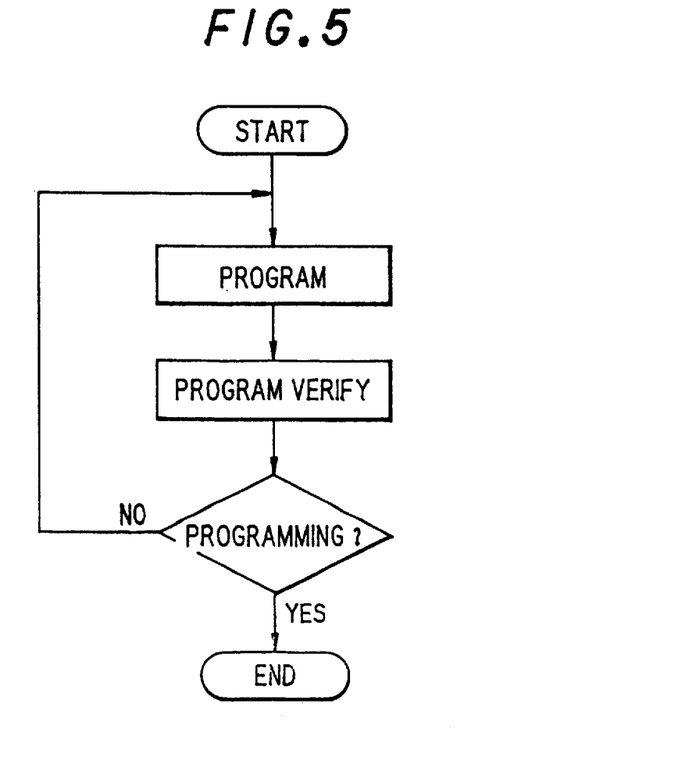
FIG. 5 is a flow chart showing the program verifying of EEPROM.
Figure 6:
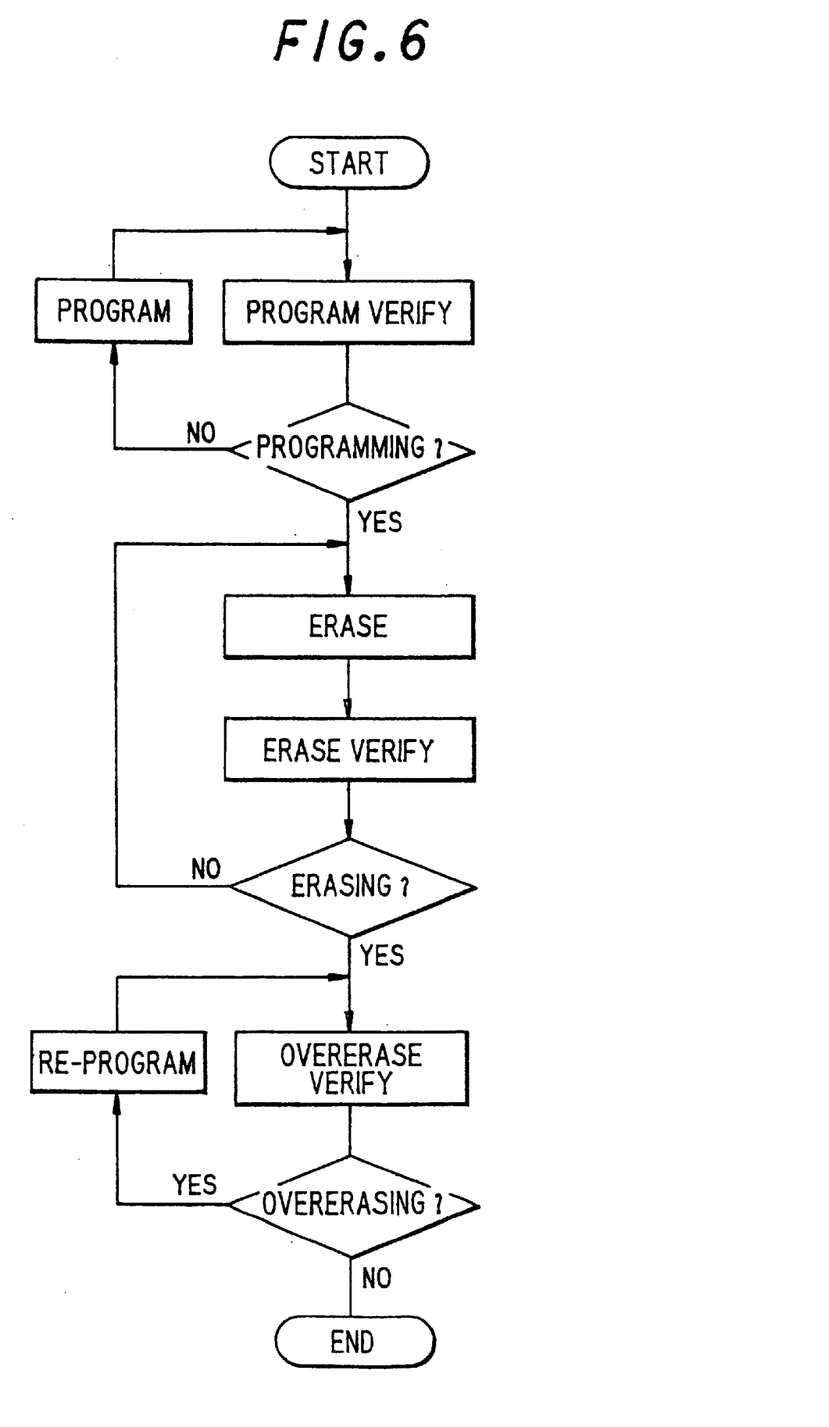
FIG. 6 is a flow chart showing the erase verifying and over-erase verifying of flash EEPROM.

FIG. 5 is a flow chart of the program verify and FIG. 6 is a flow chart of the erase verify and over-erase verify. In FIG. 6, before erasing, all memory cells need to be programmed temporarily. This is because the amount of electron injected into the floating gate is different between a memory cell that stores "0" and a memory cell that stores "1", and therefore one cell is over-erased when these cells are erased at once. After that, conducting the erasing, then the verifying is conducted. When the over-erasing is detected in the over-erase verify, the re-programming is conducted by charging a little electric charge into the floating gate to restore it.

As explained above, it will be appreciated that in the flash EEPROM, three kinds of verify levels are necessary. When verifying, the relative relationship in size between the gate voltage of memory cell and the gate voltage of reference cell is important. Now, provided that the gate voltages for the program verify, erase verify and over-erase verify of memory cell are $V_{MW}$, $V_{ME}$ and $V_{MR}$, respectively, and the gate voltages for the program verify, erase verify and over-erase verify of reference cell are $V_{RW}$, $V_{RE}$ and $V_{RR}$, respectively, if $V_{MX}=V_{ME}=V_{MR}$ is given simply, it is understood that $V_{RW}<V_{RE}<V_{RR}$ is to be established, considering the meaning of each verifying described earlier. Namely, when the gate voltage of memory cell is referenced, the relative difference between the gate voltage of memory cell and the gate voltage of reference cell increases in the order of program verify, erase verify and over-erase verify. When the gate voltage of reference cell is referenced, it does so in the inverse order.

In any case, three reference cells with different relative differences from the gate voltage of memory cell are necessary. However, it is difficult to build in accurately the threshold values in the fabrication process since it takes a long time. So, in this invention, only an actual reference cell is provided and other two are provided imaginatively on the actual reference cell. Thus, the gate voltages of memory cell and reference cell are enabled to be set independently. Also, the threshold voltage of actual reference cell is assigned to the erase verify level that is required most accurate.

Figure 7:
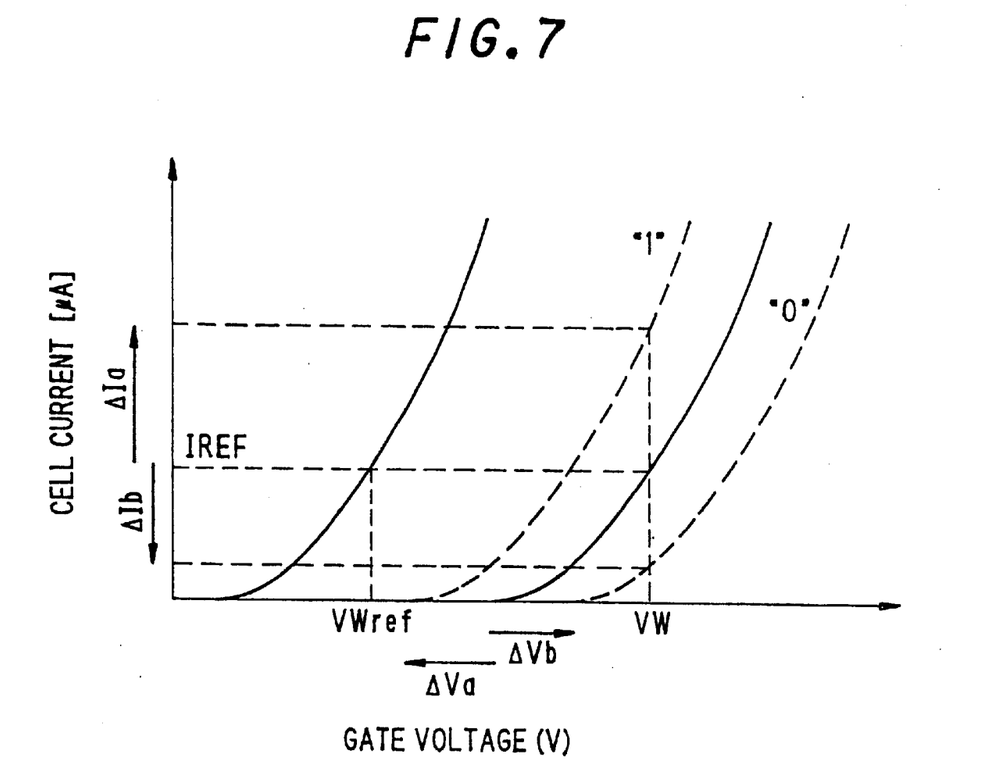
FIG. 7 is a graph showing a current-to-gate voltage curve of a reference transistor in reading and verifying in this invention.

Also, in this invention, from the above-mentioned reasons, the sense amplifier is configured to be symmetrical during verifying, where the dummy load transistors TL1 and TL2 do not operate simultaneously as shown in FIG. 1. Therefore, it does not occur that the slope of the current versus gate voltage curve for reference cell transistor is gentler than that for memory cell transistor as shown i FIG. 2. FIG. 7 shows current versus gate voltage curves (dotted lines) for memory cell transistor and a current versus gate voltage curve (full line on the right) for reference cell transistor in the erase verify, and a current versus gate voltage curve (full line on the left) for reference cell transistor in the program verify. In FIG. 7, all the slopes are same, therefore it will be understood that the sensitivity of sense amplifier is also same at both the memory cell side and the reference cell side.

Under the above conditions, in the erase verify, the gate voltage of memory cell is allowed to be equal to that of reference cell. This is because, since the threshold voltage is built in accurately to the erase verify level, output is securely obtained from ON memory cell having the normal distribution as shown in FIG. 4 and because the sensitivity of sense amplifier is equal.

Figure 8:
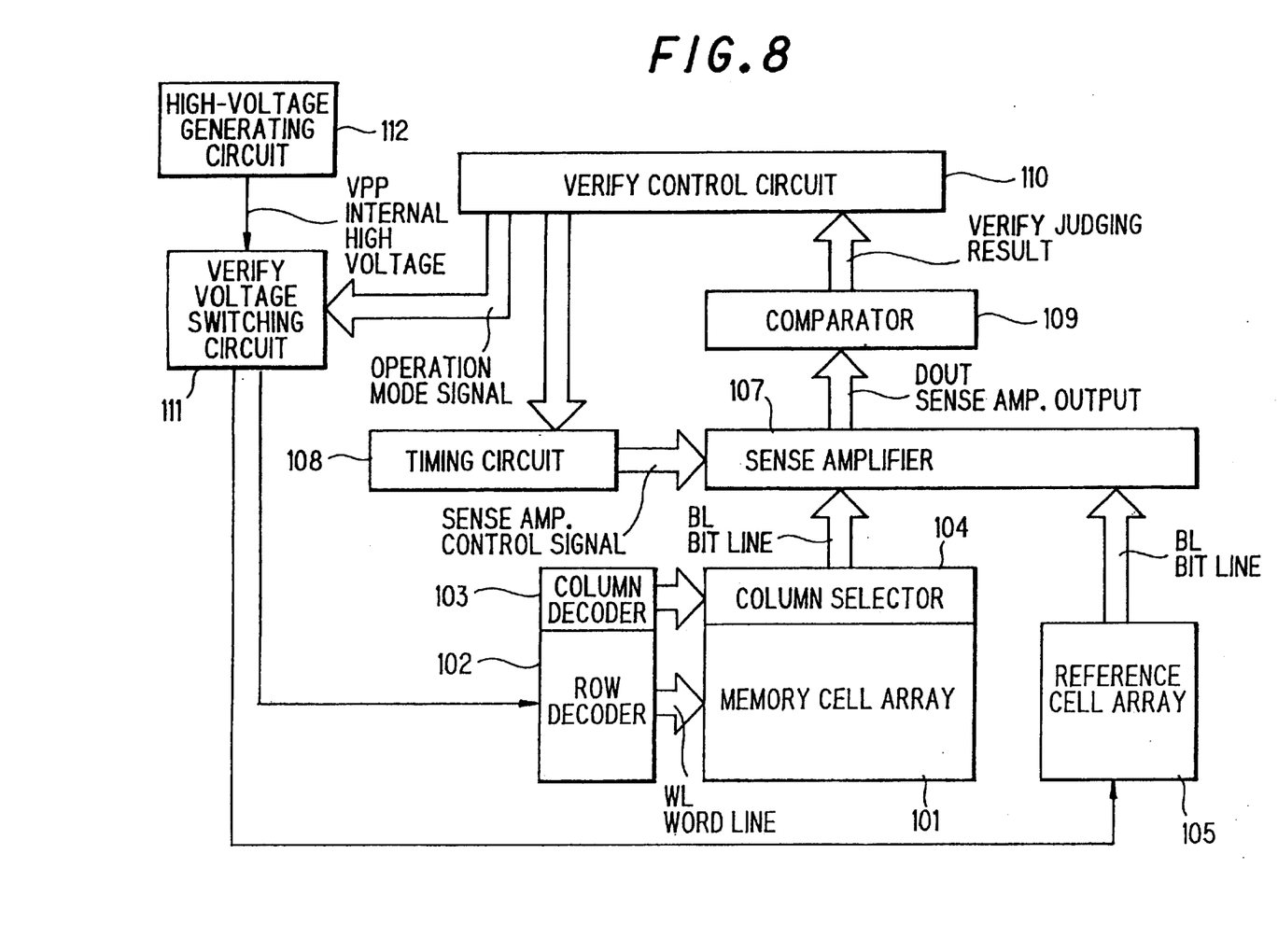
FIG. 8 is a circuit diagram showing a non-volatile semiconductor storage device in a preferred embodiment according to the invention.

FIG. 8 is a block diagram showing a non-volatile semiconductor storage device in the preferred embodiment according to the invention. This device is composed of a memory cell array 101 that is a group of flash memory cells, a row decoder 102 to select a specific memory cell from the memory cell array 101, a column decoder 103, a column selector 104, a reference cell array 105 including one reference cell, a sense amplifier 107 to compare output of memory cell and output of reference cell, a timing circuit 108 to control the sense amplifier 107, a comparator 109 that conducts the verify judgement to the output DOUT of the sense amplifier 107 and outputs the verify judgement result, a verify voltage switching circuit 111 that switches the verify voltage according to an operation mode signal and supplies it to the row decoder 102 and the reference cell 105, a high-voltage generating circuit 112 to feed an internal high voltage VPP to the verify voltage switching circuit 111, and a verify control circuit 110 to control the verify voltage switching circuit 111 and the timing circuit 108. Meanwhile, FIG. 8 shows the circuit necessary to conduct the verifying of the memory cell array 101 and a circuit used only in normal operation is not shown.

When conducting the verifying of the memory cell array 101, the verify control circuit 110 outputs, for example, a verify signal, a program mode signal, an erase mode signal, an over-erase mode signal etc. according to the verify program. Meanwhile, it goes without saying that programming is conducted prior to the program verify and erasing is conducted prior to the erase verify and over-erase verify, as shown in FIGS. 5 and 6. The verify voltage switching circuit 111, in response to these signals, generates a verify signal necessary during verifying from the internal high voltage VPP of the high-voltage generating circuit 112 and supplies it to the row decoder 102 and the reference cell array 105. The row decoder 102 applies the verify voltage to a selected memory cell gate, and the reference cell array 105 applies it to a reference cell gate.

The selection of memory cell, though not shown in FIG. 8, is performed for all memory cells in the memory cell array 101 by switching the address signal to the row decoder 102, column decoder 103 and column selector 104. On the other hand, there is only one reference cell for all memory cells.

Output of a memory cell and output of the reference cell are compared by the sense amplifier 107 in response to a sense amplifier control signal from the timing circuit 108, the sense amplifier output DOUT is given to the verify judgement in the comparator 109. In the program verify, when the current of a certain memory cell (corresponding to an address designated to be programmed in advance) in the memory cell array 101 is less than the current of the reference cell, the verify judgement result is determined good. Also, in the erase verify, when the current of every memory cell is more than the current of the reference cell, the verify judgement result is determined good. Further, in the over-erase verify, when the current of every memory cell is less than the current of the reference cell, the verify judgement result is determined good. Meanwhile, when judged as failure, re-programming is performed and the over-erase verify is repeated until the verify judgement result is good.

These verify judgement results are input to the verify control circuit 110, and the verify control circuit 110 stores the verify judgement result, which can be displayed on CRT and output to the printer.

Figure 9:
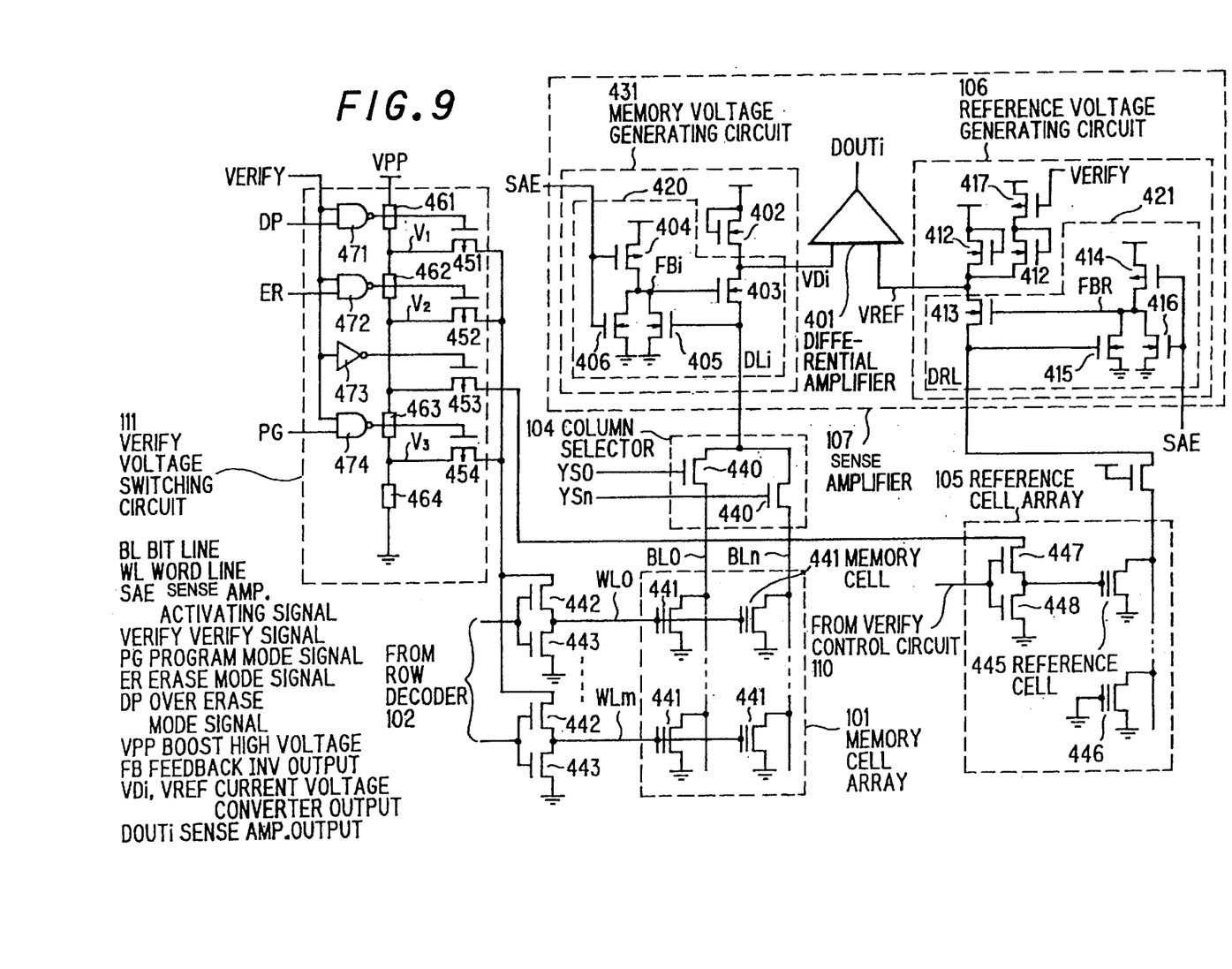
FIG. 9 is a circuit diagram showing an example circuit configuration of the device in FIG. 8.

FIG. 9 shows a detailed composition of a specific example of the block diagram in FIG. 8. The memory cell array 101 is composed of a (m+1) rows×(n+1) columns matrix of memory cells 441, which are flash memory cells. To selected one of word lines WL0 to WLm, the gate voltage from the row decoder 102 is supplied. Meanwhile, reference numbers 442 and 443 indicate transistors that supply the verify voltage from the verify voltage switching circuit 111 to the word lines WL0 to WLm and are the final stage of the row decoder 102. One of bit lines BL0 to BLn is selected by the column selector 104. After all, the output of a memory cell 441 that is full-selected by semi-selected word line and bit line is input to the sense amplifier 107.

On the other hand, the reference cell array 105 is composed of one reference cell 445 wherein the threshold voltage is built in accurately, memory cells 446 of number m that the drains are connected to the same line as the reference cell and the gates are grounded, and transistors 447 and 448 that supply the verify voltage from the verify voltage switching circuit 111 to the gate of the reference cell 445. Meanwhile, the m memory cells 446 are provided so that the bit lines BL0 to BLn and the reference line of the reference cell 445 have the same floating capacity to improve the reading operation.

The sense amplifier 107 is composed of a memory voltage generating circuit 431 to convert the output current of the memory cell 441 into voltage on the left side of a differential amplifier 401 and a reference voltage generating circuit 106 to convert the output current of the reference cell 445 into voltage on the right side of the differential amplifier 401. The differential amplifier 401 amplifies the voltage difference between the current voltage converter output VDi of the memory voltage generating circuit 431 and the current voltage converter output VREF of the reference voltage generating circuit 106, then outputting it as output DOUT of the sense amplifier.

Here, in the normal operation that the verify signal VERIFY from the reference voltage generating circuit 106 is non-enabled (low level), a PMOS transistor 417 turns ON, thereby two NMOS transistors 412 are connected in parallel. In verifying when the verify signal is enabled, the PMOS transistor 417 turns OFF, thereby the composition of the memory voltage generating circuit 431 becomes equal to that of the reference voltage generating circuit 106, and the sense amplifier 107 becomes symmetrical.

As a result, the reference voltage VREF of the sense amplifier 107 in the normal operation becomes a half of that in the verifying. Thus, by setting the gate voltages of the memory cell 441 and the reference cell 445 to be equal, in the normal operation, the reference level of the sense amplifier 107 is set to be intermediate between output of memory cell when reading "1" and output of memory cell when reading "0". On the other hand, in the verifying, it is judged whether the threshold of memory cell is higher or lower than a given level. Since the threshold voltage is difficult to measure, current flowing when applying a certain voltage to the gate is compared. For example, in the program verify, if current (dotted liens in FIG. 7) flowing through the memory cell is less (dotted line "0" in FIG. 7, $\Delta Ib$) than reference current (full line on the right in FIG. 7), it is determined greater than a given threshold ($\Delta Vb$). If the current is more (dotted line "1" in FIG. 7, $\Delta Ia$) than that, it is determined smaller than the given threshold (ΔVa). When a voltage sense type sense amplifier is used like this embodiment, the same judgement as the above case of comparing by current can be given by setting the memory voltage generating circuit 431 and the reference voltage generating circuit 106 to have a same current-voltage conversion ratio.

Also, the full line on the left in FIG. 7 is a reference characteristic curve for the erase verify that is set to the reference cell. When applying voltage VWref to the gate of the reference cell 445, current IREF flows. Also, when applying voltage VW to the gate of memory cell 441, if the memory cell is at the program verify level, current IREF flows. Here, voltage VW is set so as to give:

$$VS-VWref=(\text{program verify level})-(\text{erase verify level})$$

By setting thus, even when a reference cell for the program verify is not provided, the program verify level can be judged using the reference cell for the erase verify level.

Meanwhile, the sense amplifier 107 actuates in response to sense amplifier enabling signal SAE from the timing circuit 108, and parts with reference numbers 420 and 421 are circuits for supplying a low constant voltage to the memory cell array 101 and reference cell array 105.

The verify voltage switching circuit 111 is composed of four resistors 461 to 464 for dividing the internal high voltage VPP from the high-voltage generating circuit 112 into $V_1$, $V_2$ and $V_3$, three NAND gates 471, 472 and 474, an inverter 473, and four PMOS transistors 451 to 454. When verify signal VERIFY is enabled, voltage $V_2$ is supplied to the reference cell array 105 by the inverter 473 and the PMOS transistor 453.

Also, voltage $V_3$ is supplied to the memory cell array 101 when program verify signal PG is enabled, voltage $V_2$ is supplied thereto when erase mode signal ER is enabled, and voltage $V_1$ is supplied thereto when over-erase mode signal DP is enabled. Namely, in every verify mode, the same voltage $V_2$ is applied to the reference cell array 105, and three kinds of voltage $V_1$, $V_2$ and $V_3$ are applied to the memory cell array 101 according to the mode. Also, in the erase verify, same voltage $V_2$ is applied to the memory cell array 101 and the reference cell array 105.

Here, given that the threshold voltage of the reference cell 445 is $V_{TM}$, and the threshold voltages of OFF and ON cells in FIG. 4 are $V_F$ and $V_N$, respectively, in the program verify, erase verify and over-erase verify, the following expressions each are established:

$$f(V_1-V_F) < f(V_2-V_{TM})$$

$$f(V_2-V_N) > f(V_2-V_{TM})$$

$$f(V_3-V_N) < f(V_2-V_{TM})$$

wherein f(x) is given as $I_D=f(V_c-V_{TM})$.

Now, given that $V_{TM}=3[V]$, the minimum value of threshold voltage $V_F$ (program verify level) is 6[V], and the maximum and minimum values of threshold voltage $V_N$ (erase verify level) is 3[V] and 1[V], respectively, the following are calculated:

$$V_1-6=V_2-3 \therefore V_1=V_2+3$$

$$V_2-3=V_2-3$$

$$V_3-1=V_2-3 \therefore V_3=V_2-2$$

Therefore, for example, when $V_2=5[V]$, $V_1=8[V]$ and $V_3=3[V]$ are obtained.

In this example, in the erase verify, the gate voltage $V_2$ of the memory cell 441 is made 4[V] which is equal to that of the reference cell 445. This is because as a gate voltage 1[V] higher than the threshold voltage $V_{TM}=3[V]$ is applied to the reference cell 445, it is intended to confirm whether the threshold voltage $V_N$ of ON cell is lower than the erase verify level ($=V_{TM}$) or not.

Also, in the program verify, the gate voltage $V_3$ of the reference cell 445 is 1[V] while the gate voltage $V_2$ of the memory cell 441 is 4[V]. The difference, 3[V] is equal to the difference between the program verify level, 6[V] and the erase verify level, 3[V]. This is because even for the OFF cell that the most severe programming is conducted and the threshold voltage $V_F$ is minimum, it is intended to secure a margin of 3[V] when shifting to ON cell.

Further, in the over-erase verify, the gate voltage $V_2$ of the memory cell 441 is 4[V] while the gate voltage $V_1$ of the reference cell is 6[V]. The difference is equal to the difference, 2[V] between the erase verify level, 3[V] and the over-erase verify level, 1[V]. This is because it is intended to confirm that the output current from the reference cell 445 is more than the output current all memory cells 441 from ON cell with the threshold voltage at erase verify level of 3[V] equal to the threshold voltage of the reference cell 445 to ON cell with the threshold voltage at over-erase level of 1[V] that is lowered by the width of erase threshold distribution.

Although in the example in FIG. 9 the gate voltage of the reference cell 445 is made constant in all verify modes, this invention is not limited to this example. Voltages $V_1$, $V_2$ and $V_3$ can be provided with various values when the above-mentioned relative relationship between the gate voltage of the memory cell 441 and the gate voltage of the reference cell 445 is obtained.

Meanwhile, though not shown so as to avoid the complication of drawing, it includes means for switching so that in the normal operation same gate voltage is applied to the memory cell 441 and the reference cell 445.

Figure 10:
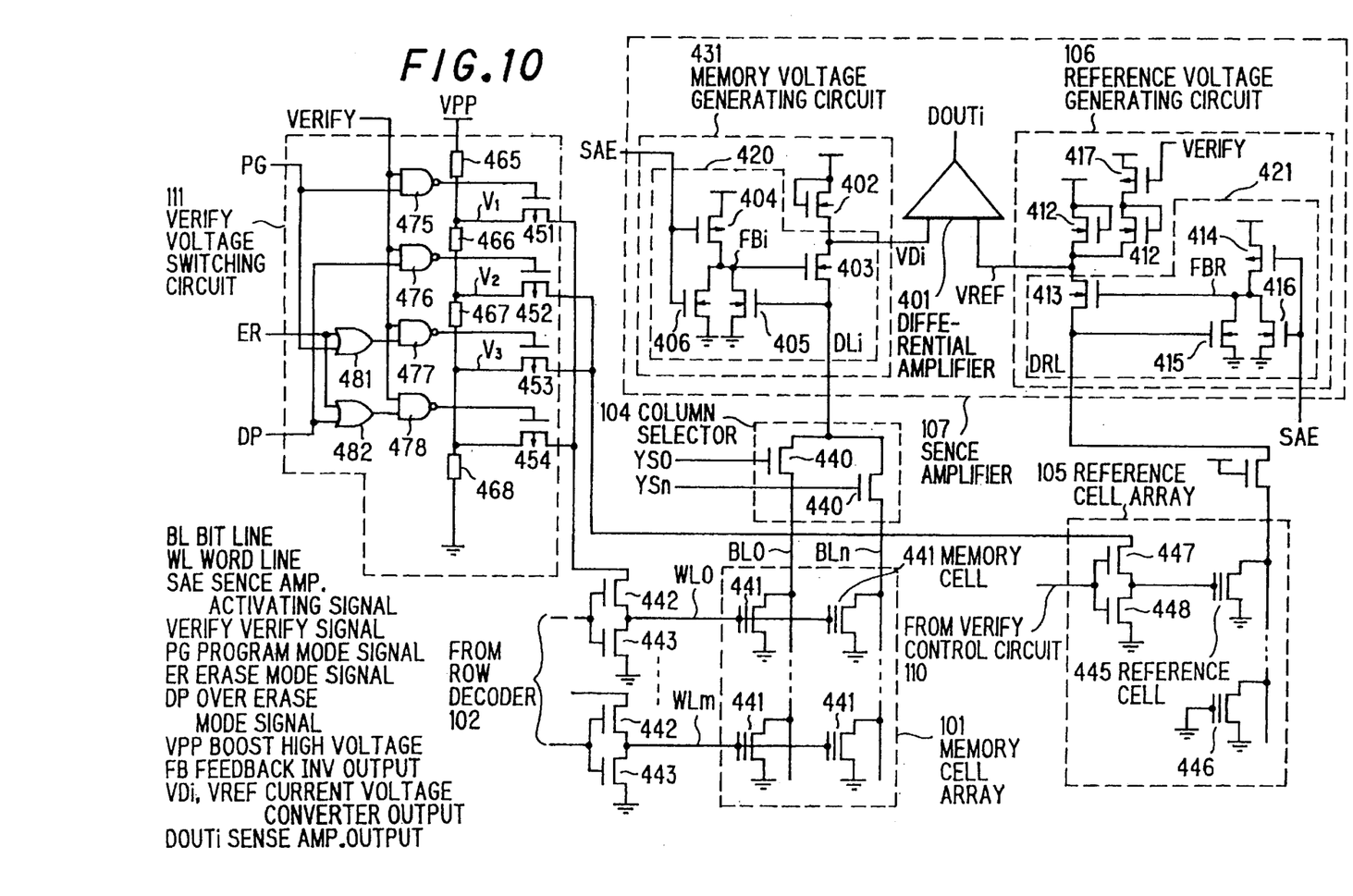
FIG. 10 is a circuit diagram showing another example of a circuit configuration of the device in FIG. 8.

FIG. 10 shows another example. In the erase verify, both the gate voltages of the memory cell 441 and the reference cell 445 are set $V_3=4[V]$. In the program verify, the gate voltage of the memory cell 441 is set $V_1=7[V]$ and the gate voltage of the reference cell 445 is set $V_1=4[V]$. Also, in the over-erase verify, the gate voltage of the memory cell 441 is set $V_3=4[V]$ and the gate voltage of the reference cell 445 is set $V_2=6[V]$.

Also in this example, like the example in FIG. 9, in the erase verify, the gate voltage of the memory cell 441 is equal to that of the reference cell 445. In the program verify, the gate voltage of the memory cell 441 is set higher than that of the reference cell 445 by the difference between the program verify level and the erase verify level. In the over-erase verify, the gate voltage of the reference cell 445 is set higher than that of the memory cell 441 by the width of erase threshold distribution.

Figure 3:
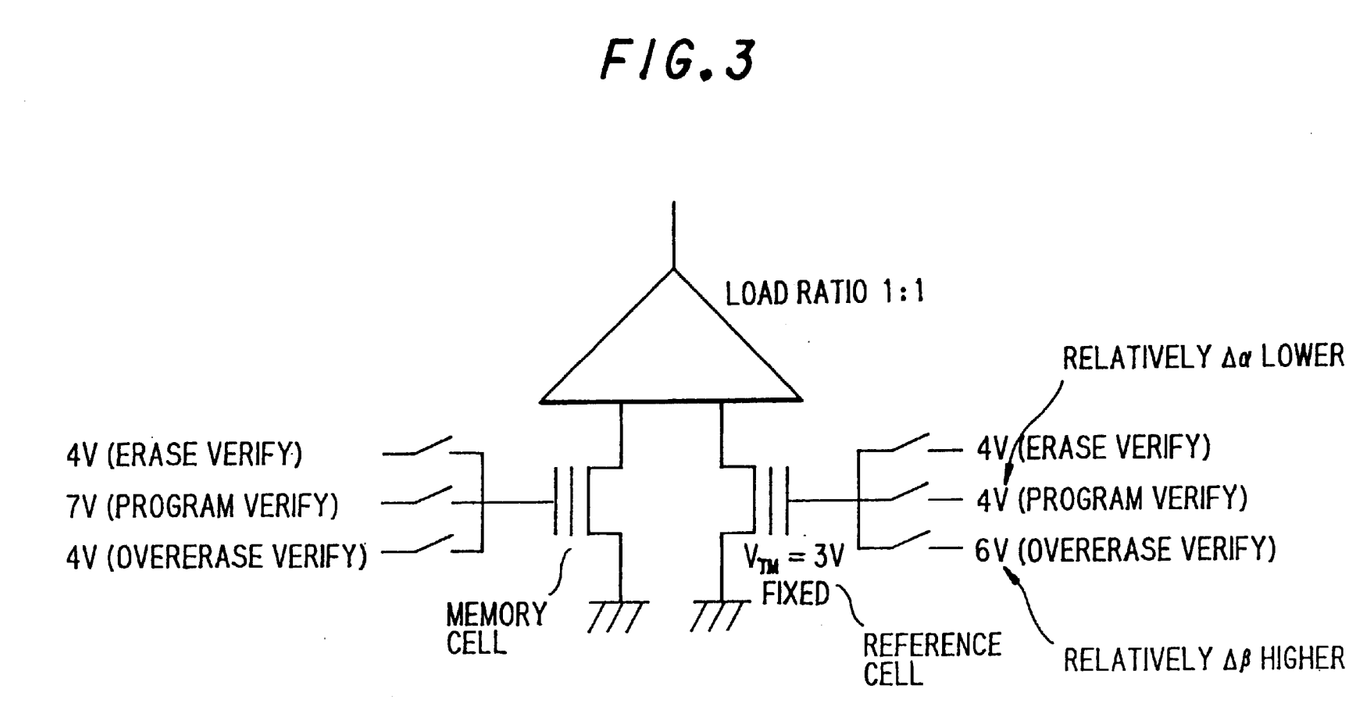
FIG. 3 is an illustration showing an idea of the invention.

FIG. 3 shows a summary of the second example. Referring to FIG. 3 together with FIG. 4 that shows the threshold voltage distribution of OFF cell and ON cell, the meaning of the values of gate voltage will be more easily understood.

Although in this embodiment the circuit composition only using positive voltage is shown, the invention can be applied to a non-volatile semiconductor storage device with positive and negative power sources.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An electrically erasable and programmable non-volatile semiconductor storage device that data is read out comparing the output of a memory cell and the output of a reference cell by a sense amplifier, wherein:

said reference cell is built in so that it has a given threshold voltage value, and the gate voltage of said memory cell and the gate voltage of said reference cell are allowed to be set independently.

2. An electrically erasable and programmable non-volatile semiconductor storage device, according to claim 1, wherein said given threshold voltage of said reference cell is an upper-limit value of a threshold voltage for erasing said memory cell in the storage device.

3. An electrically erasable and programmable non-volatile semiconductor storage device, according to claim 1, wherein:

in verifying, said sense amplifier has equal sensitivity to both the memory cell side and the reference cell side.

4. An electrically erasable and programmable non-volatile semiconductor storage device, according to claim 1, wherein:

in erase verifying, the gate voltage of said memory cell is set to be equal to that of said reference cell.

5. An electrically erasable and programmable non-volatile semiconductor storage device, according to claim 1, wherein:

in program verifying, the gate voltage of said memory cell is set to be relatively higher than that of said reference cell.

6. An electrically erasable and programmable non-volatile semiconductor storage device, according to claim 1, wherein:

said device is a flash EEPROM, and in over-erase verifying, the gate voltage of said reference cell is set to be relatively higher than that of said reference cell.

7. An electrically erasable and programmable non-volatile semiconductor storage device, according to claim 5, wherein:

the relative difference between the gate voltages of said memory cell and reference cell is given by changing the gate voltage of said reference cell in the erase verifying and the over-erase verifying while keeping the gate voltage of memory cell constant.

8. An electrically erasable and programmable non-volatile semiconductor storage device, according to claim 6, wherein:

the relative difference between the gate voltages of said memory cell and reference cell is given by changing the gate voltage of said reference cell in the erase verifying and the over-erase verifying while keeping the gate voltage of memory cell constant.

9. An electrically erasable and programmable non-volatile semiconductor storage device, according to claim 5, wherein:

the relative difference between the gate voltages of said memory cell and reference cell is given by changing the gate voltage of said memory cell in the erase verifying and the over-erase verifying while keeping the gate voltage of memory cell constant.

10. An electrically erasable and erasable non-volatile semiconductor storage device, according to claim 6, wherein:

the relative difference between the gate voltages of said memory cell and reference cell is given by changing the gate voltage of said memory cell is in the erase verifying and the over-erase verifying while keeping the gate voltage of reference cell constant.

11. An electrically erasable and programmable non-volatile semiconductor storage device, according to claim 5, wherein a difference between said gate voltage of said memory cell and said gate voltage of said reference cell is the difference between a lower-limit value of a threshold voltage of said memory cell during programming and an upper-limit value of said threshold voltage of said memory cell during erasing.

12. An electrically erasable and programmable non-volatile semiconductor storage device, according to claim 6, wherein:

the relative difference between said gate voltages is determined as the width of erase threshold distribution.

13. An electrically erasable and programmable non-volatile semiconductor storage device, according to claim 2, wherein:

the gate voltages of said memory cell and said reference cell are determined dividing same power source voltage using resistors.

14. An electrically erasable and programmable non-volatile semiconductor storage device, according to claim 4, wherein:

the gate voltages of said memory cell and said reference cell are determined dividing same power source voltage using resistors.

15. An electrically erasable and programmable non-volatile semiconductor storage device, according to claim 5, wherein:

the gate voltages of said memory cell and said reference cell are determined dividing same power source voltage using resistors.

16. An electrically erasable and programmable non-volatile semiconductor storage device, according to claim 6, wherein:

the gate voltages of said memory cell and said reference cell are determined dividing same power source voltage using resistors.

17. An electrically erasable and programmable non-volatile semiconductor storage device, the device comprising:

a memory cell having a memory output;

a reference cell having a reference output and a threshold voltage; and a sense amplifier comparing said memory output and said reference output and reading out data in the semiconductor storage device, a gate voltage of said reference cell being independently set to be higher than a gate voltage of said memory cell while the semiconductor storage device is operating in an over-erase verifying mode.

* * * * *